(12) United States Patent
Goldstein et al.

(10) Patent No.: US 8,781,319 B2
(45) Date of Patent: Jul. 15, 2014

(54) CONFIGURABLE POINT-TO-POINT OPTICAL COMMUNICATIONS SYSTEM BETWEEN SERVERS

(75) Inventors: Martin Goldstein, Campbell, CA (US); Terrel Morris, Garland, TX (US); Eric Peterson, McKinney, TX (US); Paul Kessler Rosenberg, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 350 days.

(21) Appl. No.: 13/143,905

(22) PCT Filed: Jan. 9, 2009

(86) PCT No.: PCT/US2009/030665
§ 371 (c)(1),
(2), (4) Date: Jul. 8, 2011

(87) PCT Pub. No.: WO2010/080158
PCT Pub. Date: Jul. 15, 2010

(65) Prior Publication Data
US 2011/0268441 A1   Nov. 3, 2011

(51) Int. Cl.
*H04B 14/00* (2006.01)
*G02B 6/26* (2006.01)
*G02B 6/12* (2006.01)
*G02B 6/42* (2006.01)

(52) U.S. Cl.
USPC ............. 398/45; 398/43; 385/15; 385/19; 385/37; 385/17; 385/20

(58) Field of Classification Search
USPC .................................... 398/43, 45
See application file for complete search history.

(56) References Cited

U.S. PATENT DOCUMENTS

| 5,042,889 | A | * | 8/1991 | Benzoni | 385/16 |
| 5,345,521 | A | | 9/1994 | McDonald et al. | |
| 5,903,687 | A | * | 5/1999 | Young et al. | 385/17 |
| 7,209,621 | B2 | | 4/2007 | Glebov et al. | |
| 7,293,129 | B2 | | 11/2007 | Johnsen et al. | |
| 7,356,638 | B2 | | 4/2008 | Holland et al. | |

(Continued)

FOREIGN PATENT DOCUMENTS

| CN | 1805344 | 7/2006 |
| JP | 1993-252113 | 9/1993 |

(Continued)

OTHER PUBLICATIONS

European Search Report (Supplementary), Jul. 23, 2012, Hewlett-Packard Development Company, et al., EP Application No. 09837743.5.

*Primary Examiner* — Oommen Jacob (57) ABSTRACT

A configurable optical communications system (100) for establishing point-to-point communications between multiple computer servers (160) coupled to a common midplane or backplane communications bus (132), wherein at least two of the servers include an optical input/output device (170) for sending and receiving an optical signal (112). The system further includes an optical communications pathway (140) that is configured to carry the optical signal, and at least two pivotable mirrors (150) located within the optical pathway and in-line with the optical input/output devices that are selectively orientated to direct the optical signal between the optical input/output devices to establish the point-to-point communication between the at least two servers.

17 Claims, 6 Drawing Sheets

(56) References Cited

U.S. PATENT DOCUMENTS

| | | |
|---|---|---|
| 7,376,295 B2 | 5/2008 | Lee et al. |
| 7,450,857 B2 | 11/2008 | Dress et al. |
| 2002/0133146 A1* | 9/2002 | Telfair et al. ............... 606/5 |
| 2002/0178319 A1 | 11/2002 | Sanchez-Olea |
| 2005/0147414 A1 | 7/2005 | Morrow et al. |
| 2006/0008199 A1 | 1/2006 | Glebov et al. |
| 2006/0062512 A1* | 3/2006 | Lee et al. ................. 385/15 |
| 2006/0159456 A1 | 7/2006 | Gumaste et al. |
| 2006/0193112 A1* | 8/2006 | Cauthron ............... 361/683 |
| 2007/0159682 A1 | 7/2007 | Tanaka et al. |
| 2007/0234130 A1 | 10/2007 | Sullivan et al. |
| 2008/0166131 A1 | 7/2008 | Hudgins et al. |
| 2008/0310852 A1 | 12/2008 | Tan et al. |

FOREIGN PATENT DOCUMENTS

| | | |
|---|---|---|
| JP | 1995-135499 | 5/1995 |
| JP | 2002-131573 | 5/2002 |
| JP | 2003-004963 | 1/2003 |
| JP | 2005-167583 | 6/2005 |
| JP | 2006-525536 | 11/2006 |
| JP | 2007-104487 | 4/2007 |

* cited by examiner

CONFIGURABLE POINT-TO-POINT OPTICAL COMMUNICATIONS SYSTEM BETWEEN SERVERS

BACKGROUND OF THE INVENTION

The growth of the Information Technology sector in the economy has led providers of on-line information and services, in-house enterprise data management groups, government agencies and others to establish high-volume data processing centers, also known as server farms, to process, manage and store large amounts of information. The constant pressures to increase bandwidth, processing power, storage capacity and reliability has resulted in high-density computational platforms and architectures, such as blade servers installed in standardized rack enclosures and assembled into server towers.

BRIEF DESCRIPTION OF THE DRAWINGS

Features and advantages of the present invention will be apparent from the detailed description that follows, and when taken in conjunction with the accompanying drawings together illustrate, by way of example, features of the invention. It will be readily appreciated that these drawings merely depict exemplary embodiments of the present invention and are not to be considered limiting of its scope, and that the components of the invention, as generally described and illustrated in the figures herein, could be arranged and designed in a wide variety of different configurations. Nonetheless, the present invention will be described and explained with additional specificity and detail through the use of the accompanying drawings, in which:

FIG. 1b is a back perspective view of the prior art blade server of FIG. 1a;

FIG. 2b is a back perspective view of the blade server of FIG. 2a;

FIG. 3 illustrates an exploded, perspective view of an optical communications pathway and two optical input/output devices, in accordance with the embodiment of FIG. 2a;

FIG. 4 illustrates a side sectional view of an optical communications pathway and two attached optical input/output devices, in accordance with the embodiment of the FIG. 2a;

FIG. 5 illustrates a close-up side sectional view of a pivoting mirror located within the optical communications pathway of FIG. 2a;

FIG. 6 illustrates a side sectional view of the optical communications pathway and four attached optical input/output devices, in accordance with the embodiment of the FIG. 2a;

FIG. 7 illustrates a perspective view of an optical port and pivoting mirror in the optical communications pathway of the FIG. 2a;

FIG. 8a illustrates a close-up sectional view of a pivoting mirror located within the optical communications pathway of FIG. 2a;

DETAILED DESCRIPTION OF EXEMPLARY EMBODIMENTS

The following detailed description of exemplary embodiments of the invention makes reference to the accompanying drawings, which form a part hereof and in which are shown, by way of illustration, exemplary embodiments in which the invention may be practiced. While these exemplary embodiments are described in sufficient detail to enable those skilled in the art to practice the invention, it should be understood that other embodiments may be realized and that various changes to the invention may be made without departing from the spirit and scope of the present invention. As such, the following more detailed description of the embodiments of the present invention is not intended to limit the scope of the invention as it is claimed, but is only presented for purposes of illustration: to describe the features and characteristics of the present invention; to set forth the best mode of operation of the invention; and to sufficiently enable one skilled in the art to practice the invention. Accordingly, the scope of the present invention is to be defined solely by the appended claims.

The present invention describes a system and method for configurable point-to-point optical communications between computer servers, and more specifically for configurable point-to-point optical communications between blade servers that can be installed inside a blade rack or enclosure and communicate through a common midplane (or backplane) communications bus. The present invention addresses the problems encountered with current blade server architectures that limit the communications between the individual blade servers mounted within the rack to the midplane bus or to non-configurable point-to-point communications between adjacent blades.

Figure 1A:
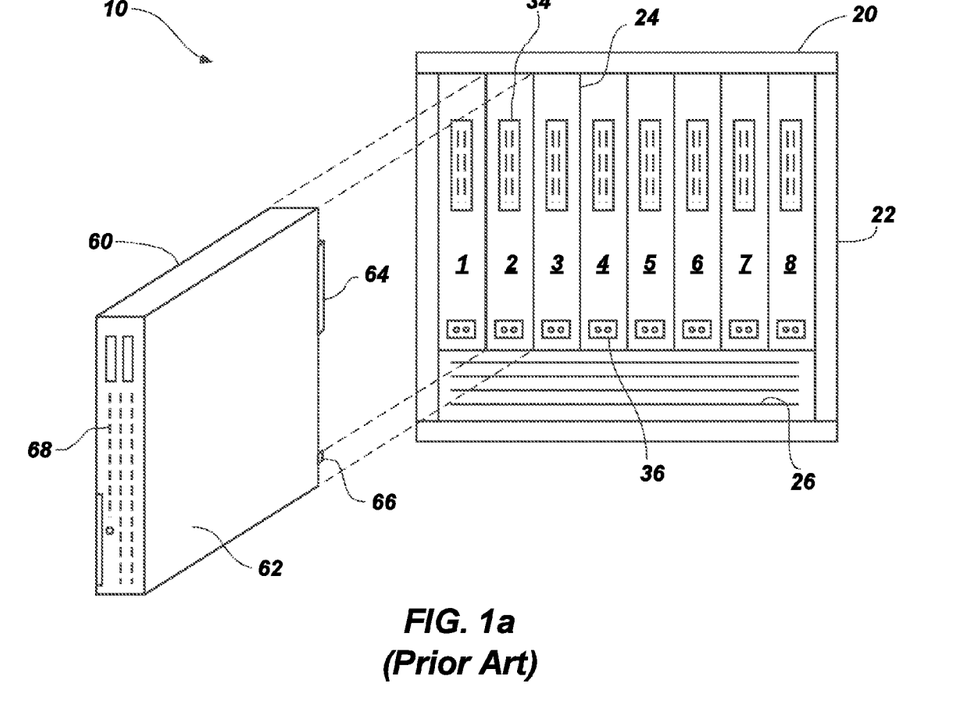
FIG. 1a illustrates a front perspective view of a prior art blade server and blade server enclosure.
Figure 1B:
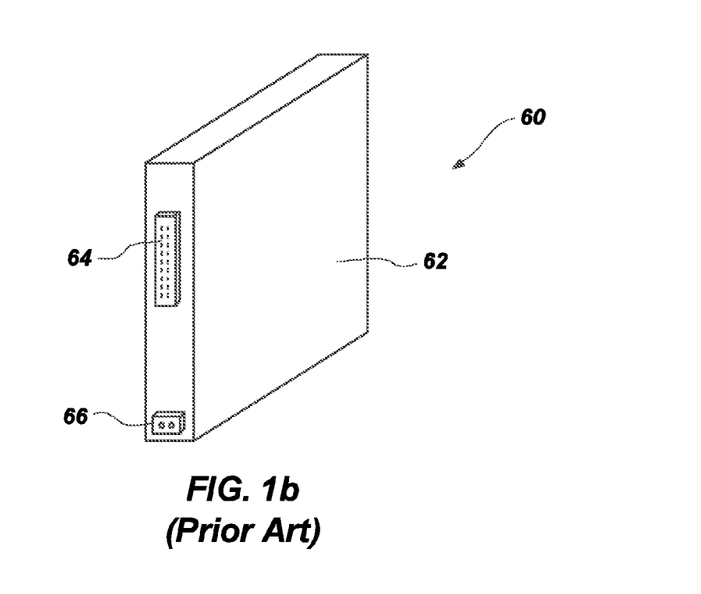

Shown in FIGS. 1a and 1b is the architecture of an illustrative prior art blade server system 10, as found in many present-day blade server systems. In its basic form, the blade architecture can generally include a standard 19" blade server rack enclosure 20 that can be mounted with several similar racks into a tall cabinet casing to form a fixed tower, or into a shorter cabinet to form a more portable stand-alone unit. Each rack enclosure can include an outer casing 22 that provides the structural support for mounting slots 24 for up to eight full-height server blades 60. The individual server blades 60 can provide the processing and memory storage functions, etc., for the computer system. The server enclosure 20 can also include power supplies 26, interconnect bays and cooling fans (not shown), and a monitoring management system (also not shown) that allow each blade server system 10 to function as a self-contained, stand-alone computer system.

A wide variety of blade server designs have been developed to optimize the computing functions of a server system, such as generalized compute blades, memory or disc drive blades and video graphics blades, etc. While the individual blades can perform different functions, they share a common form factor and connection interface. For instance, each blade server 60 can have an outer casing 62 with standardized dimensions that are configured to fit within the enclosure mounting slots 24, a communications connector 64 that interfaces with the midplane 34 (or backplane) bus connectors in the enclosure 20, and a power connector 66 that mates with the power bus 36 in the enclosure.

The blade server system 10 provides advantages over earlier-generation server systems. The modular design of the individual rack-mounted elements allows for each blade 60 to be removable and replaceable from the rack enclosure 20, so that only the problematic blade needs to be removed and replaced in the event of a failure. The blade server system 10 can also be easily configured, expanded or upgraded, since the various blades can all interface with the same midplane bus connectors 34 and can be installed into any slot 24. And by sharing common power supplies and I/O interconnection modules, significant economies of scale can also be achieved.

Although the bus communications architecture allows for a modular system, it can also serve as a bottleneck for certain multi-blade server applications requiring even faster communications. Such situations can include, but are not limited to, high-speed memory access, video graphics processing, and express input/output communications that provide additional connectivity beyond the interconnection modules included in the blade server system 10, etc. One prior art solution is to directly connect two adjacent or non-adjacent blades using front access connectors. However, this creates additional physical access and service issues that can quickly defeat the modular benefits of the blade server system. Another option is to provide a dedicated, hard-wired connection between two adjacent mounting slots that supplements the midplane bus interface, providing point-to-point communications between a primary blade and a piggy-back blade when they are installed next to each other. However, this second approach is also limiting in that the user must organize the blades to enable slot-to-slot adjacency, and is still unable to allocate the piggy-backed resource to different compute blades at different times without physically re-arranging the blades.

The present invention is a supplemental point-to-point communications system that overcomes the front access and slot-to-slot adjacency limitations by providing one or more sets of arbitrary blade-to-blade communication pathways that can be statically or dynamically configured. The system includes an optical pathway that can be installed internal to the blade server enclosure with optical interface ports located within each slot. The interface ports can interface with or couple to optical input/output devices attached to the blade servers. Each optical interface port can include a configurable mirror that can direct an optical signal generated by a blade server's optical input/output device in either direction along the optical pathway, and can reflect a complimentary signal coming from the opposite direction back to the same input/output device.

The mirrors carried in the optical interface ports can be statically or dynamically configured by the blade's input/output device. Blade servers not utilizing the supplemental optical pathway may not be equipped with the optical input/output devices, in which case the configurable mirrors in the associated optical ports can remain in a neutral position to allow the optical signals to pass unhindered.

The configurable point-to-point communications system and method of the present invention provides several significant advantages over prior-related blade-to-blade communications systems, some of which are recited here and throughout the following more detailed description. For instance, the user of the present invention is provided with additional options and flexibility in configuring his systems and scaling his compute resources (CPU, Memory, I/O, etc.) to match current workload and data center resource availability, without resorting to dedicated, interlinked blade-to-blade connections or the use of front access connectors. In one example, the user could allocate the compute resources of a floating-point accelerator blade to a number of different compute blades at different times, without having to physically move the blade to enable slot-to-slot adjacency.

The above-recited advantages will be apparent in light of the detailed description set forth below and best understood with reference to the accompanying drawings, wherein the elements and features of the invention are designated by numerals throughout. These advantages are not meant to be limiting in any way. Indeed, one skilled in the art will appreciate that other advantages may be realized, other than those specifically recited herein, upon practicing the present invention.

Figure 2A:
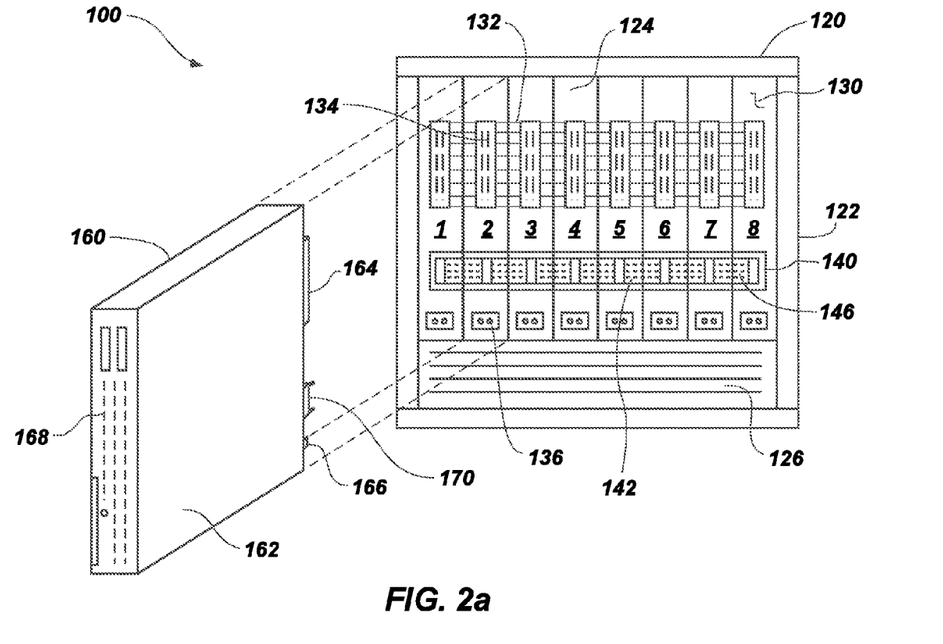
FIG. 2a illustrates a front perspective view of a blade server and blade server enclosure, in accordance with an exemplary embodiment of the present invention.
Figure 2B:
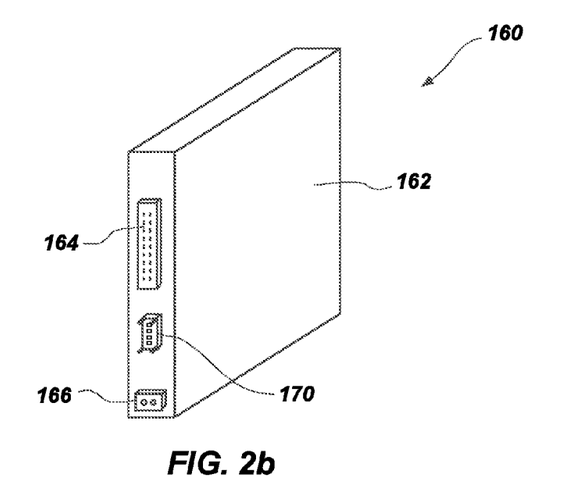

Illustrated in FIGS. 2a and 2b is a blade server system that includes an exemplary embodiment 100 of the configurable point-to-point communications system of the present invention. The blade server system can include a blade server enclosure 120 or rack and a plurality of blade servers 160 that interface with and communicate through a common midplane (or backplane) bus 132. Similar to the blade server system described above, the enclosure 120 can include an outer casing 122 that provides the structural support for the mounting slots 124 that can hold up to eight full-height blade servers 160, as well as power supplies 126, interconnect bays and cooling fans (not shown), and a monitoring management system (also not shown). The modular blade servers 160 can have an outer casing 162 with standardized dimensions corresponding with the dimensions of the enclosure mounting slots 124, a communications connector 164 that interfaces with the midplane 134 (or backplane) bus connections in the enclosure, and a power connector 166 that mates with the power bus 136 in the enclosure.

Blade server system 100 can also include an optical communications pathway 140 that can be comprised of one or more optical channels 142. In one aspect of the present invention, the optical channels 142 can be hollow metal waveguides. In the exemplary embodiment shown, the optical communications pathway can include four parallel, side-by-side optical channels 142 or hollow metal waveguides that have been drawn in exaggerated size for illustrative purposes. Each hollow metal waveguide can have an inside diameter that is at least 50 times larger than the largest wavelength of the optical signal. Although the exemplary embodiment is shown with the optical pathway 140 having four separate optical channels 142 or waveguides, this should not be construed in any way as limiting to the invention. One, two, six, eight, twelve, twenty four, or any number of optical channels 142 or waveguides can combined together to form the optical communications pathway 140 of the present invention.

The optical communications pathway 140 can be installed interior to the rack enclosure 120 and along the midplane 130 that forms the back boundary for the mounting slots 124. The optical pathway can be located adjacent to and parallel with, either above or below, the line of the midplane bus connections 134. The optical pathway 140 can include optical ports 146 in each mounting slot 124 that can provide access to the optical channels 142 inside the optical pathway for each installed blade server 160. In the exemplary blade server system 100 illustrated in FIG. 2a, the enclosure includes eight mounting slots numbered 1 through 8 with corresponding optical ports 1 through 8. The present invention can also be used in blade server enclosures that include a greater or lesser number of mounting slots. Half-height mounting slots with separate sets of midplane bus connections, power connections and optical ports for each half-height server blade are also considered to fall within the scope of the present invention.

An optical input/output device 170 can be located on the back panel of the blade server 160 at a position that corresponds or mates with the optical ports 146 when the blade has been installed in the mounting slot 124. The optical input/out device 170 can convert the electrical signals used inside the blade server into optical signals that can be transmitted through the optical pathway to another blade, as well as convert received optical signals back into electrical signals. Therefore, each optical input/output device 170 can include an optical signal generator, such as a laser or an LED, and an optical detector, such as a photo detector, for each optical channel 142 in the optical pathway 140. In another aspect, optical signals within the server can be directly transmitted through the optical pathway without the need for conversion.

Figure 3:
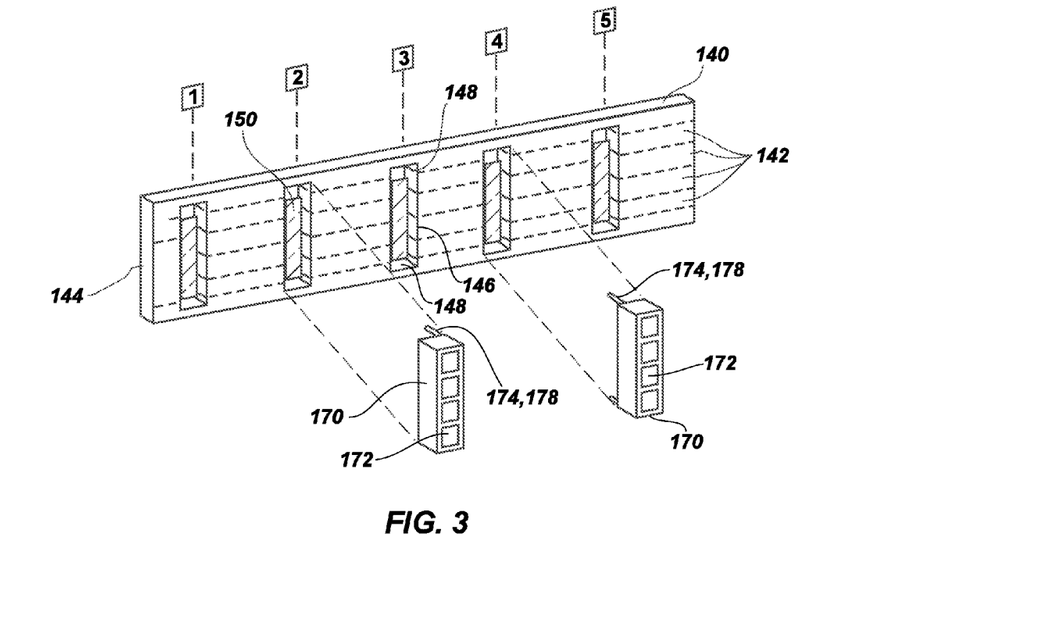

Illustrated in FIG. 3 is an exploded, perspective view of the optical communications pathway 140 shown in FIG. 2a, and two optical input/output devices 170 extending from the back panels of two blade servers, which are not shown for clarity purposes. As can be seen, the optical pathway 140 can be a rectangular or ribbon-like structure comprised of optical channels 142 that can be built up and around a substrate 144. The substrate 144 and optical channels 142 can be made from flexible materials that allow the optical pathway 140 to slightly flex and conform to the various structures with which it connects, while still enabling the light beams or optical signals to travel efficiently through the optical channels 142. As stated above, the optical channels can be large core hollow metal waveguides having inside passages with a major dimension that is at least 50 times greater than the largest wavelength of the optical signal.

Optical ports 1-5 can be positioned at pre-defined intervals along the optical pathway that correspond with the distances between mounting slots in the server enclosure. In one aspect of the present invention, actuator holes 148 can be located at either or both ends of the optical ports to allow an actuator mechanism 174 to enter the optical pathway 140 and selectively orientate a pivotable mirror 150 that is centered in each of the optical ports 146.

The two optical input/output devices 170 can each include a number of optical signal generators/receivers 172 that send and receive the optical signals through the optical communications pathway. In the embodiment shown in FIG. 3, each input/output device includes four optical signal generators/receivers 172 to match the four optical channels 142 comprising the optical pathway 140. However, it is not a requirement of the invention that number of signal generators/receivers 172 and hollow metal waveguides 142 be equivalent to each other. In some cases there may be a different number of optical channels available in the optical pathway than there are signal generators/receivers to utilize them. Moreover, it is possible that the position of the input/output devices 170 along the long axis of the blade servers can be adjusted to allow different pairs of blade servers to access and utilize different optical channels 142 in the same optical communications pathway 140.

Figure 4:
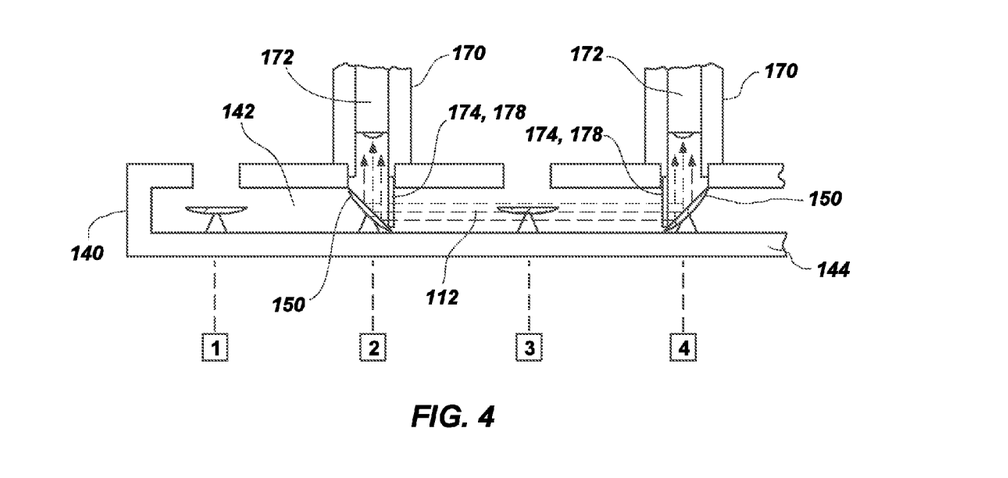

The two optical input/output devices 170 can further include an actuation mechanism 174 that can be used to control the position of the pivotable mirrors carried inside the optical pathway and centered within each optical port. In one aspect of the present invention, the actuation mechanism can be simple pin-like structures 178 that extend from both ends of the input/output device 170 to form a prong. As can be seen in FIGS. 3 and 4, the actuator pins 178 can enter the actuator holes 148 at either end of the optical ports 146 to press one side of the pivotable mirror 150 and rotate the mirror a selected angle, such as 45 degrees, until it contacts or registers against the top and bottom surfaces of the optical channel 142. In this position, the pivotable mirror will reflect any optical signal transmitted from the signal generators 172 attached to the associated blade server at an angle of approximately 90 degrees into the plane of the optical pathway. Likewise, any light received from the optical pathway is reflected 90 degrees from the pathway and back to a signal generator/receiver 172.

It can be readily appreciated that to couple an optical signal 112 between two blade servers, the corresponding pair of pivotable mirrors 150 must be rotated towards each other. Thus, the actuation mechanism 174 or pins 178 can be adjusted to be on the inside positions of the two optical input/output devices 170. The actuator pins 178 can be fixably attached to the input/output devices 170, so that a user can easily configure a blade server for point-to-point communication by simply attaching an optical input/output device with the actuation mechanism in the correct position. However, this static configuration may require the user to remove the blade if adjustments were needed. In another aspect of the present invention, the optical input/output devices can be configured with actuator pins 178 that can be dynamically extended or retracted in accordance with a mechanical or electronic actuation device, allowing the user to dynamically reconfigure the optical pathways connecting the various blade servers mounted in the rack enclosure.

As illustrated in FIGS. 3 and 4, the optically-coupled input/output devices 170 can be attached to blade servers that need not be adjacent to each other. For instance, one blade can be installed into slot #2 while the other is installed into slot #4. Other variations are also possible, as the optical channels 142 and the optical input/output devices 170 can be matched together so that there is no harmful degradation in an optical signal traveling the entire length of the optical pathway 140. Thus, point-to-point or blade-to-blade communication can be as effective between blade servers located in slots #1 and #8 as blades located in adjacent slots #1 and #2, so long as any intervening pivotable mirrors remain unused and in the neutral position.

Figure 5:
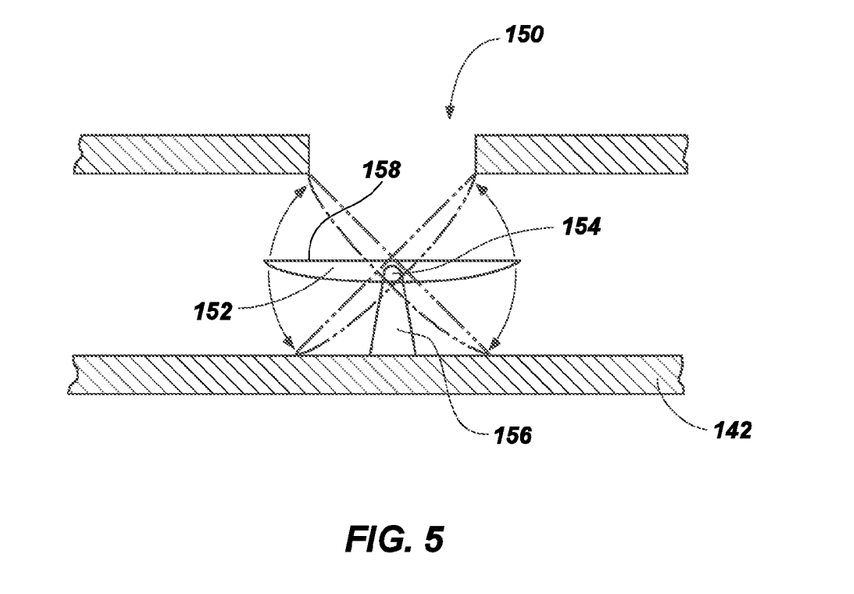

The close-up of the pivotable mirror 150 illustrated in FIG. 5 can include a mirror body 152 mounted with a rotating joint 154 or axle to a pivot post 156. The top reflective surface 158 of the mirror body can comprise a fully-reflective mirrored surface. As shown, the pivotable mirror can have three distinct positions: neutral, tilted 45 degrees to the left, and tilted 45 degrees to the right. When the mirror is in the neutral position, the cross-sectional profile or aspect ratio of the mirror can be small enough to allow a beam of light or optical signal to pass substantially unhindered. When the mirror is pivoted to the left or the right, the reflective top surface 158 can substantially block the optical channel 142 and reflect the optical signal 90 degrees relative the long axis of the optical channel.

The mirror body 152 can be sized large enough so that tips of the pivoting mirror 150 contact the top and/or and bottom surfaces of the optical channel 142 when the pivoting mirror is rotated 45 degrees in either direction. Alternatively, other registering surfaces can be provided at the ends of the pivoting mirror 150, etc., to ensure that the mirror is not over- or under-rotated when selectively orientated or actuated to couple an optical signal into or out-of the optical communications pathway 140.

Figure 6:
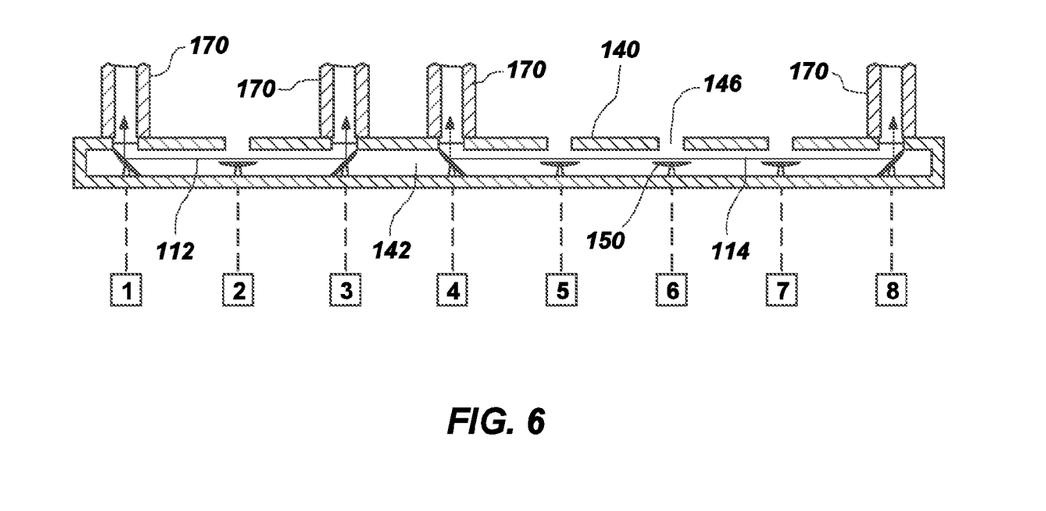

The pivotable mirror 150 can be biased towards the neutral position with a biasing device, such as a mechanical spring or springs (not shown). Thus, as illustrated in FIG. 6, the default orientation for the pivotable mirrors located at each of the optical ports 146 formed in the optical communications pathway 140 can be the neutral position, so that a beam of light can travel the length of optical pathway until a blade server with an attached optical input/output device 170 is installed into one of the rack enclosure's mounting slots.

The simple design of the communications system of the present invention allows for a single optical communications pathway 140 to simultaneously provide point-to-point communications between multiple pairs of blade servers. As shown in FIG. 6, a first pair of optical input/output devices 170 (each being attached to a different blade server or blade device) can be installed in optical ports #1 and #3 to communicate through the optical pathway 140 via optical signal 112. Simultaneously, a second pair of optical input/output devices 170 can be installed in optical ports #4 and #8 to communicate via optical signal 114.

As can be seen, up to four pairs of blade servers can share the same optical channels 142, as long as each blade in a blade server pair is installed into adjacent mounting slots/optical ports 146. It can be appreciated that additional combinations are also possible so long as there is no overlap between pairs of blade servers using the same optical channels in the optical pathway. However, if the optical input/output devices 170 can be configured to access different optical channels 142 in the same optical pathway 140, as described above, a wide variety of additional combinations are possible.

Figure 7:
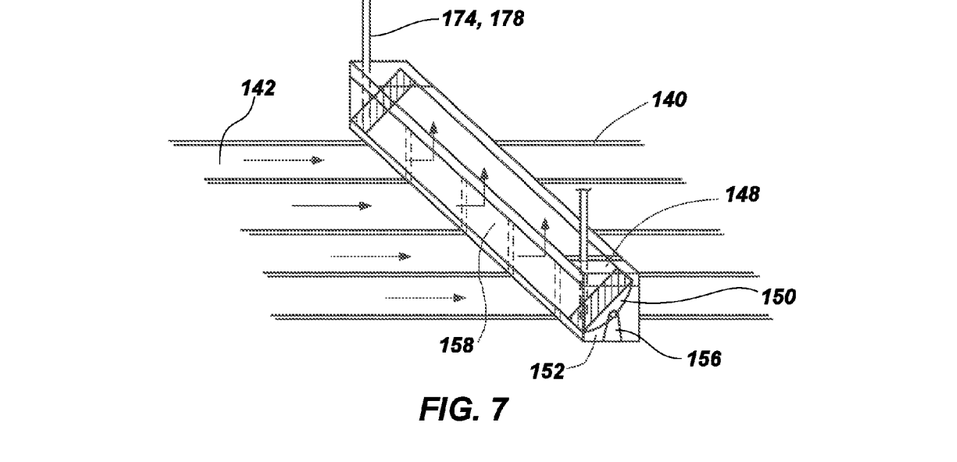

FIG. 7 provides a close-up, cut-away view of an optical port 146 and pivoting mirror 150 in the optical communications pathway 140, in accordance with one embodiment of the present invention. The optical port 146 can cut across all four optical channels 142 to allow for a common pivoting mirror 150 to simultaneously reflect the optical signals in each optical channel when selectively oriented to the 45 degree position. As shown, the ends of the mirror body 152 can extend beyond the outer walls of the two outermost optical channels to provide bearing surfaces that can be contacted by mechanical actuation devices 174 entering through actuation holes 148, such as the actuator pins 178 extending from the optical input/output device as previously described.

While the illustrated optical port 146 configuration can be simple to operate with just two actuation devices 174 acting on the single pivoting mirror 150, it is to be appreciated that additional optical port and pivoting mirror designs are also possible. For instance, in one aspect of the present invention the pivoting mirror may not rotate about a pivot post 156 or fulcrum, but instead be supported on an axle that extends through the sidewalls of the optical pathway 140, etc. In another aspect, each optical channel 142 may be configured with its own pivoting mirror and actuation system. Alternatively, the pivoting mirror may not pivot whatsoever, but can instead comprise a silvered, 45 degree wedge-shaped structure that extend upwards from the bottom of the optical channel to re-direct the beam out of the optical port. Accordingly, any actuatable mirror capable of being selectively orientated to couple an optical signal into or out-of the optical communications pathway 140 and in either direction along the optical channels 142 can be considered to fall within the scope of the present invention.

Figure 8A:
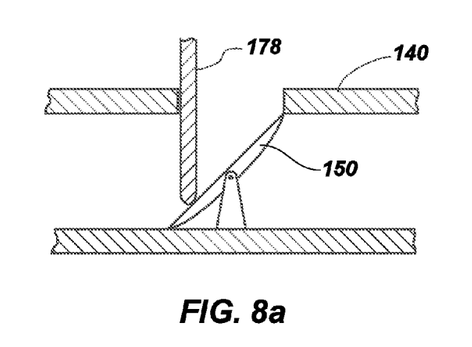
Figure 8B:
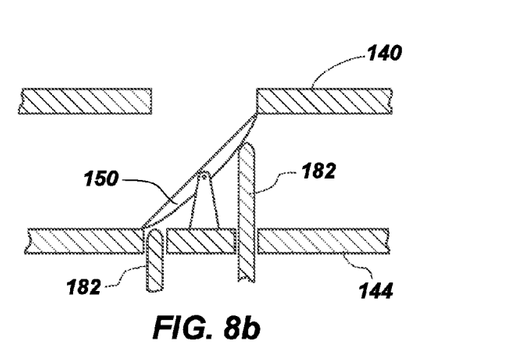
FIG. 8b illustrates a close-up, side sectional view of a pivoting mirror, in accordance with another exemplary embodiment of the present invention

Likewise, as shown in FIGS. 8a-9b, a number of mirror actuation designs are also possible. For instance, illustrated in FIG. 8a is the actuator pin 178 that can statically or dynamically extend directly from the optical input/output device attached to the blade server to selectively orientate the pivotable mirror 150. In another aspect of the present invention illustrated in FIG. 8b, one of the actuation pins 182 can dynamically extend from the back of the optical communication pathway 140 to press against the bottom of the pivotable mirror 150 and tilt it to one side or the other. The dynamically extendable pins can be extended or retracted by either a mechanical or electronic actuation device, and provide the user with the ability to reconfigure the optical pathways connecting the various blade servers mounted in the rack enclosure.

Figure 9A:
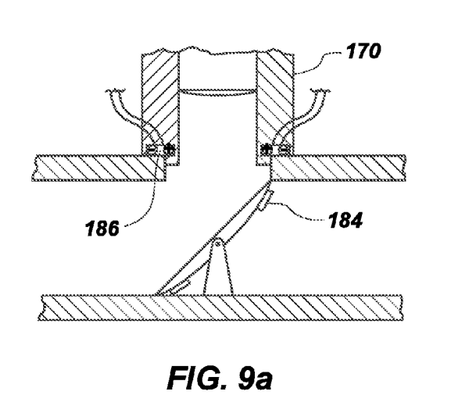
FIG. 9a illustrates a close-up, side sectional view of a pivoting mirror, in accordance with another exemplary, side embodiment of the present invention
Figure 9B:
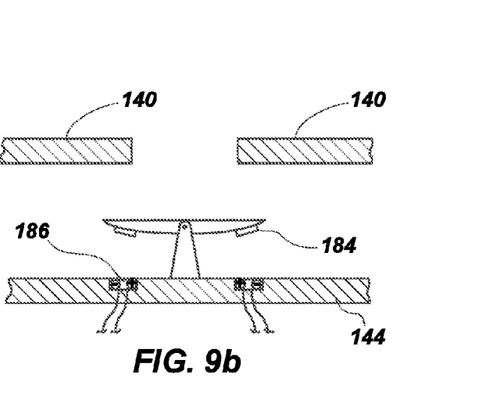
FIG. 9b illustrates a close-up, side sectional view of a pivoting mirror, in accordance with another exemplary embodiment of the present invention.

Other means of dynamically orientating the pivotable mirror are also possible, including the electromagnetic system illustrated in FIGS. 9a and 9b. Small metallic targets 184 can be attached to the backside of the pivoting mirror 150, and controllable electromagnetic coils 186 can be attached to the input/output device 170 (FIG. 9a) or to the back surface or substrate 144 of the optical communication pathway 140 (FIG. 9b). Passing an electric current through the electromagnetic coils can generate a magnetic field that alternatively attracts and repels the metallic targets and rotates the pivotable mirror to the desired positions. Additional actuation methods or dynamic orientation means for rotating the pivotable mirror, as appreciated by one of skill in the art, can be considered to fall within the scope of the present invention.

Figure 10:
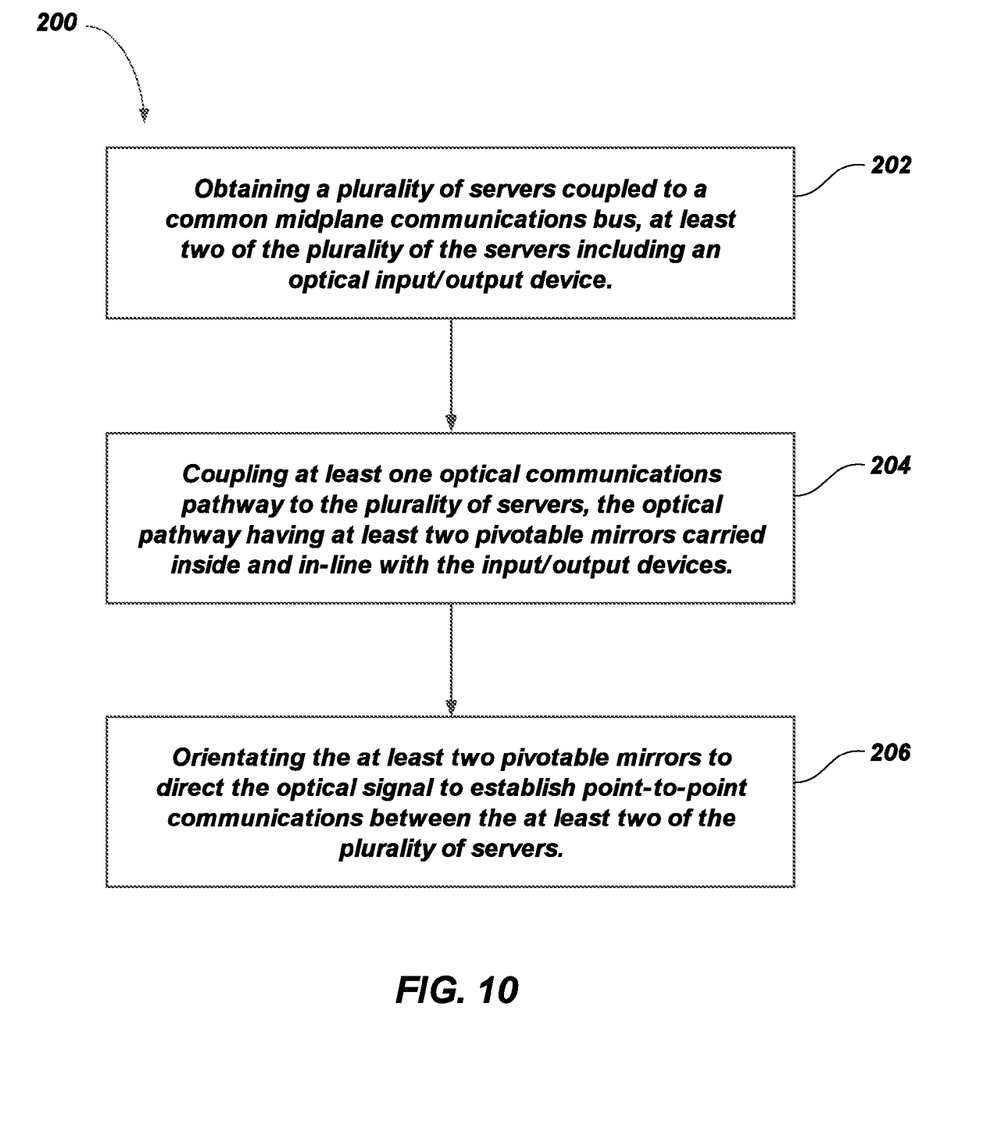
FIG. 10 is a flowchart depicting a method of configuring an optical communications pathway for point-to-point communications between a plurality of servers.

FIG. 10 is a flowchart depicting a method 200 of configuring an optical communications pathway for point-to-point communications between a plurality of servers. The method includes the step of obtaining 202 a plurality of servers that are coupled to a common midplane communications bus, and where at least two of the servers include an optical input/output device for sending and receiving an optical signal. The method includes the step of coupling 204 at least one optical communications pathway to the plurality of servers, which optical pathway has at least two pivotable mirrors carried inside and in-line with the input/output devices. The method further includes the step of orientating 206 the pivotable mirrors to direct the optical signal to establish point-to-point communications between the at least two of the plurality of servers.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

More specifically, while illustrative exemplary embodiments of the invention have been described herein, the present invention is not limited to these embodiments, but includes any and all embodiments having modifications, omissions, combinations (e.g., of aspects across various embodiments), adaptations and/or alterations as would be appreciated by those in the art based on the foregoing detailed description. The limitations in the claims are to be interpreted broadly based on the language employed in the claims and not limited to examples described in the foregoing detailed description or during the prosecution of the application, which examples are to be construed as non-exclusive. For example, in the present disclosure, the term "preferably" is non-exclusive where it is intended to mean "preferably, but not limited to." Any steps recited in any method or process claims may be executed in any order and are not limited to the order presented in the claims.

What is claimed is:

1. A configurable optical communications system for point-to-point communications between a plurality of servers comprising:

a plurality of servers coupled to a common midplane communications bus, wherein at least two of the plurality of servers include an optical input/output device for sending and receiving an optical signal;
an optical communications pathway configured to carry the optical signal;
at least two pivotable mirrors located within the optical pathway and in-line with the optical input/output devices; and
pins selectably insertable into the optical pathway to contact and move corresponding mirrors from a neutral position, in which the corresponding mirror allows the optical signal pass by that mirror along the optical pathway, to an active position, in which the corresponding mirror directs the optical signal into or out of the optical pathway;
wherein the pivotable mirrors moved by the pins are selectively orientated to direct the optical signal between the optical input/output devices and establish point-to-point communication between the at least two of the plurality of servers.

2. The communications system of claim 1, wherein the optical pathway further comprises at least one large core hollow metal waveguide having an inside waveguide diameter at least 50 times larger than a largest wavelength in the optical signal.

3. The communications system of claim 1, wherein the pivotable mirrors are fully reflecting.

4. The communications system of claim 1, wherein a substantially planar reflecting surface of the pivotable mirrors can be selectively orientated at +45 degrees, −45 degrees or 0 degrees relative to a long axis of the optical pathway.

5. The communications system of claim 1, wherein the pins are attached to the servers between which point-to-point communication is being established such that connection of such a server to the midplane communications bus causes the attached pin to selectively orient a corresponding pivotable mirror in the optical pathway for optical communication between servers.

6. The communications system of claim 1, wherein the pivotable mirrors in the optical pathway are selectively orientated by the pins which are driven by an actuation device.

7. The communications system of claim 1, further comprising a rack enclosure having mounting slots for the plurality of servers, each mounting slot having a communications interface between the servers and the common midplane communications bus.

8. The communications system of claim 7, wherein the optical pathway is mounted internal to the rack enclosure and the pivotable mirrors are located in optical ports in the optical pathway that are aligned within the mounting slots.

9. A method of configuring an optical communications pathway for point-to-point communications between a plurality of servers coupled to a common midplane communications bus, wherein at least two of the plurality of the servers include an optical input/output device for sending and receiving an optical signal; the method comprising:
inserting a pin that is attached to one of said servers into at least one optical communications pathway configured to carry the optical signal to the plurality of servers, the insertion of the pin occurring as the server to which the pin is attached is coupled to the optical pathway, the optical pathway having at least two pivotable minors carried inside the optical pathway and in-line with the input/output devices; and,
with the pin, orientating one of the pivotable mirrors to direct the optical signal for optical point-to-point communications between two of the plurality of servers.

10. The method of claim 9, wherein the pathway is a large core hollow metal waveguide having an inside waveguide diameter at least 50 times larger than a largest wavelength in the optical signal.

11. The method of claim 9, wherein the pivotable mirrors are fully reflecting.

12. The method of claim 9, further comprising orientating the pivotable mirrors having a substantially planar reflecting surface which can be selectively orientated at +45 degrees, −45 degrees or 0 degrees relative to a long axis of the optical pathway.

13. The method of claim 9, further comprising, selectively attaching said pin to a side of the server away from a side closest to a server with which communication is to be established.

14. The method of claim 9, wherein each mirror is biased to said neutral position in which that minor allows the optical signal to pass by along the optical pathway.

15. The communications system of claim 1, wherein each mirror is biased to said neutral position in which that minor allows the optical signal to pass by along the optical pathway.

16. The communications system of claim 1, wherein said pins are insertable into the optical pathway from a side of the optical pathway opposite a side of the optical pathway that optically couples with the optical input/output devices of said servers.

17. The communications system of claim 6, further comprising two pins located with each mirror and driven by the actuation device to move the corresponding mirror between the neutral and active positions.

* * * * *

UNITED STATES PATENT AND TRADEMARK OFFICE
CERTIFICATE OF CORRECTION

| | | |
|---|---|---|
| PATENT NO. | : 8,781,319 B2 | Page 1 of 1 |
| APPLICATION NO. | : 13/143905 | |
| DATED | : July 15, 2014 | |
| INVENTOR(S) | : Martin Goldstein et al. | |

It is certified that error appears in the above-identified patent and that said Letters Patent is hereby corrected as shown below:

In the Claims

In column 9, line 29, in Claim 4, delete "-45degrees" and insert -- -45 degrees --, therefor.

In column 10, line 13, in Claim 9, delete "minors" and insert -- mirrors --, therefor.

In column 10, line 35, in Claim 14, delete "minor" and insert -- mirror --, therefor.

In column 10, line 38, in Claim 15, delete "minor" and insert -- mirror --, therefor.

Signed and Sealed this
Sixth Day of January, 2015

Michelle K. Lee
*Deputy Director of the United States Patent and Trademark Office*